United States Patent
Chen

(10) Patent No.: US 7,307,571 B2
(45) Date of Patent: Dec. 11, 2007

(54) BINARY SIGNAL CONVERTERS FOR DISTINGUISHING DIRECT SIGNALS CARRIED BY NANOWIRES

(75) Inventor: Yong Chen, Redwood City, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 455 days.

(21) Appl. No.: 11/116,539

(22) Filed: Apr. 27, 2005

(65) Prior Publication Data

US 2006/0243957 A1  Nov. 2, 2006

(51) Int. Cl.
*H03M 1/00* (2006.01)
*H03K 5/08* (2006.01)

(52) U.S. Cl. .................. 341/155; 327/50; 327/309

(58) Field of Classification Search ............. 341/131, 341/155; 327/50, 306, 309–314, 319
See application file for complete search history.

(56) References Cited

U.S. PATENT DOCUMENTS

| | | | |
|---|---|---|---|
| 5,666,075 A | * | 9/1997 | Schinzel ................ 327/777 |
| 5,936,435 A | * | 8/1999 | Schwenkel et al. .......... 327/78 |
| 6,822,485 B2 | * | 11/2004 | Kattan ......................... 327/78 |
| 6,831,576 B2 | * | 12/2004 | Geiger et al. ............... 341/131 |
| 2005/0169798 A1 | * | 8/2005 | Bradley et al. .............. 422/57 |

FOREIGN PATENT DOCUMENTS

JP   58138121 A   *   8/1983

* cited by examiner

*Primary Examiner*—Howard L. Williams

(57) ABSTRACT

Various embodiments of the present invention are directed to a binary signal converter that facilitates distinguishing an original direct signal on a nanowire by superimposing an alternating signal on the original direct signal. The binary signal converter includes an alternating signal source connected to the nanowire that superimposes an alternating signal with an initial amplitude on the nanowire. The binary signal converter may also include a selective alternating signal filter that selectively passes the alternating signal from the nanowire to a signal sink.

26 Claims, 12 Drawing Sheets

| Nanowire | Nanowire |
|---|---|
| 501 | 000 |
| 502 | 001 |
| 503 | 010 |
| 504 | 011 |
| 505 | 100 |
| 506 | 101 |
| 507 | 110 |
| 508 | 111 |

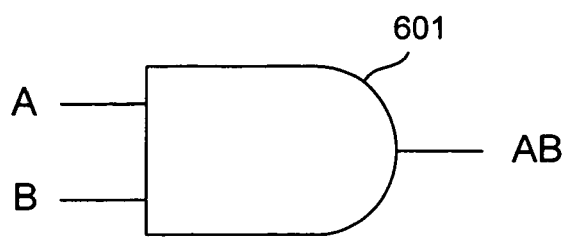
*Figure 6A*
| A | B | AB |
|---|---|----|
| 0 | 0 | 0 |
| 1 | 0 | 0 |
| 0 | 1 | 0 |
| 1 | 1 | 1 |
*Figure 6B*
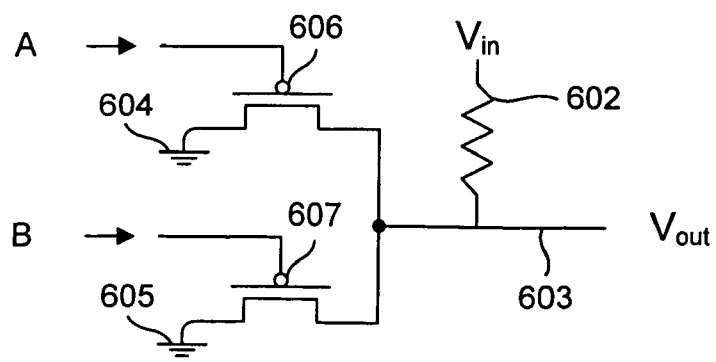
*Figure 6C*

BINARY SIGNAL CONVERTERS FOR DISTINGUISHING DIRECT SIGNALS CARRIED BY NANOWIRES

TECHNICAL FIELD

The present invention relates to electronic devices, and, in particular, to electronic device designs that can reliably output well separated, distinguishable high and low signal levels carried by nanowires.

BACKGROUND OF THE INVENTION

During the past fifty years, the electronics and computing industries have been relentlessly propelled forward by ever decreasing sizes of basic electrical components, such as transistors and signal lines, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Expensive semiconductor fabrication facilities are being rebuilt in order to use the new techniques. Many new obstacles are also expected to be encountered. For example, it is necessary to fabricate semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating submicroscale and nanoscale electronic devices using alternative technologies. Nanoscale electronic devices generally employ nanoscale signal wires having widths, and nanoscale components having dimensions, of less than 100 nanometers. More densely fabricated nanoscale electronic devices may employ nanoscale signal wires having widths, and nanoscale components having dimensions, of less than 50 nanometers, or, in certain types of devices, less than 10 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Nanowire technologies have been developed to fabricate nanoscale electronic devices, such as multiplexer/demultiplexers, by selectively fabricating simple electrical components, such as conductors, transistors, resistors, diodes, and other components, in the gaps between nanowires and overlapping address wires. In general, computational electronic devices that employ nanoscale technologies rely heavily on binary state operations. Electronic devices typically realize binary state operations by generating and transmitting distinguishable high and low voltage and/or current levels. However, at nanoscale dimensions, the electrical components often fail to reliably operate. As a result, nanowire-based nanoscale devices may output voltage and/or current levels that cannot be distinguished as high or low. Electronic devices that depend on receiving distinguishable high or low voltage and/or current levels output by nanoscale devices are, as a result, unable themselves to provide reliable output signals. Designers, manufacturers, and users of these systems have recognized the need for nanoscale-multiplexer/demultiplexer designs that can reliably output well separated, distinguishable low and high voltage and/or current levels.

SUMMARY OF THE INVENTION

Various embodiments of the present invention are directed to a binary signal converter that facilitates distinguishing an original direct signal on a nanowire by superimposing an alternating signal on the original direct signal. The binary signal converter includes an alternating signal source connected to the nanowire that superimposes an alternating signal with an initial amplitude on the nanowire. The binary signal converter may also include a selective alternating signal filter that selectively passes the alternating signal from the nanowire to a signal sink.

Various embodiments of the present invention are directed to a method for determining whether a high original direct signal or a low original direct signal is being carried on a nanowire. The method comprises providing an alternating signal source connected to the nanowire that superimposes an alternating signal with an initial amplitude on the nanowire, and providing a selective alternating signal filter that selectively passes the alternating signal from the nanowire to a signal sink. The method of the present invention may also include determining whether a high or low direct signal is carried by the nanowire based on detecting an oscillation in the superimposed signal carried by the nanowire.

Various embodiments of the present invention are directed to a multiplexer/demultiplexer nanowire that tolerates gray scale signal levels. In one embodiment of the present invention, the multiplexer/demultiplexer nanowire comprises a nanowire that carries an original signal, an alternating signal source connected to the nanowire that superimposes an alternating signal with an initial amplitude on the original signal carried by the nanowire. The multiplexer/demultiplexer nanowire may also include a diode having an anode end connected to the nanowire and a cathode end connected to a voltage sink, and a reverse-bias source connected at the cathode end of the diode that supplies a signal to set a forward bias threshold for the diode that selectively passes the alternating signal from the nanowire to the voltage sink.

DETAILED DESCRIPTION OF THE DRAWINGS

FIGS. 4A-4F schematically illustrate a number of simple electrical components that can be programmed at the nanowire junctions of nanowires in nanowire crossbars.

Figures 5A, 5B:
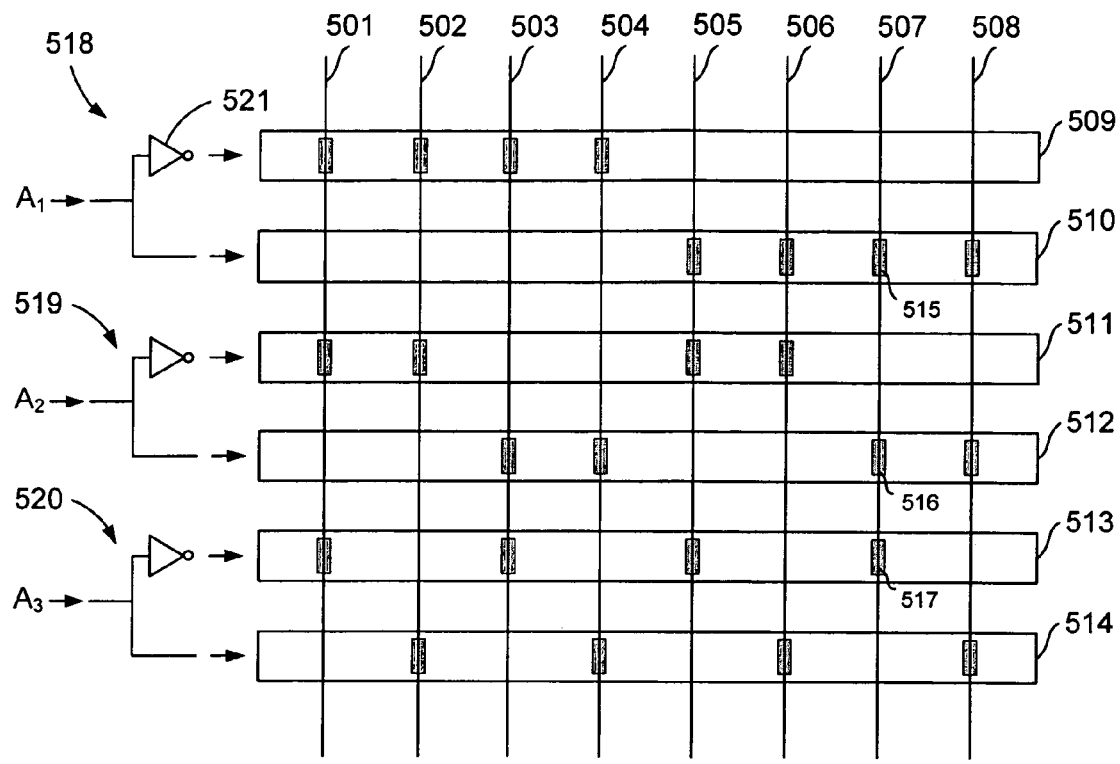

FIG. 5A illustrates an exemplary nanowire-crossbar multiplexer/demultiplexer.

FIG. 5B illustrates a summary of 3-bit binary-code nanowire addresses for the multiplexer/demultiplexer shown in FIG. 5.

FIG. 6A illustrates a two-way AND logic gate.

FIG. 6B illustrates a truth table summarizing input signal combinations and corresponding output signals for the two-way AND logic gate shown in FIG. 6A.

FIG. 6C illustrates an exemplary two-way AND logic-gate that employs pFETs to realize the two-way AND logic gate shown in FIG. 6A.

Figure 7:
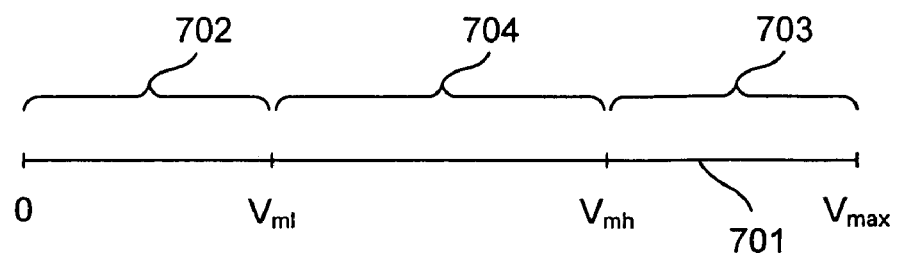

FIG. 7 shows an exemplary voltage axis that can be used to determine binary values of multiplexer/demultiplexer nanowires.

Figure 8:
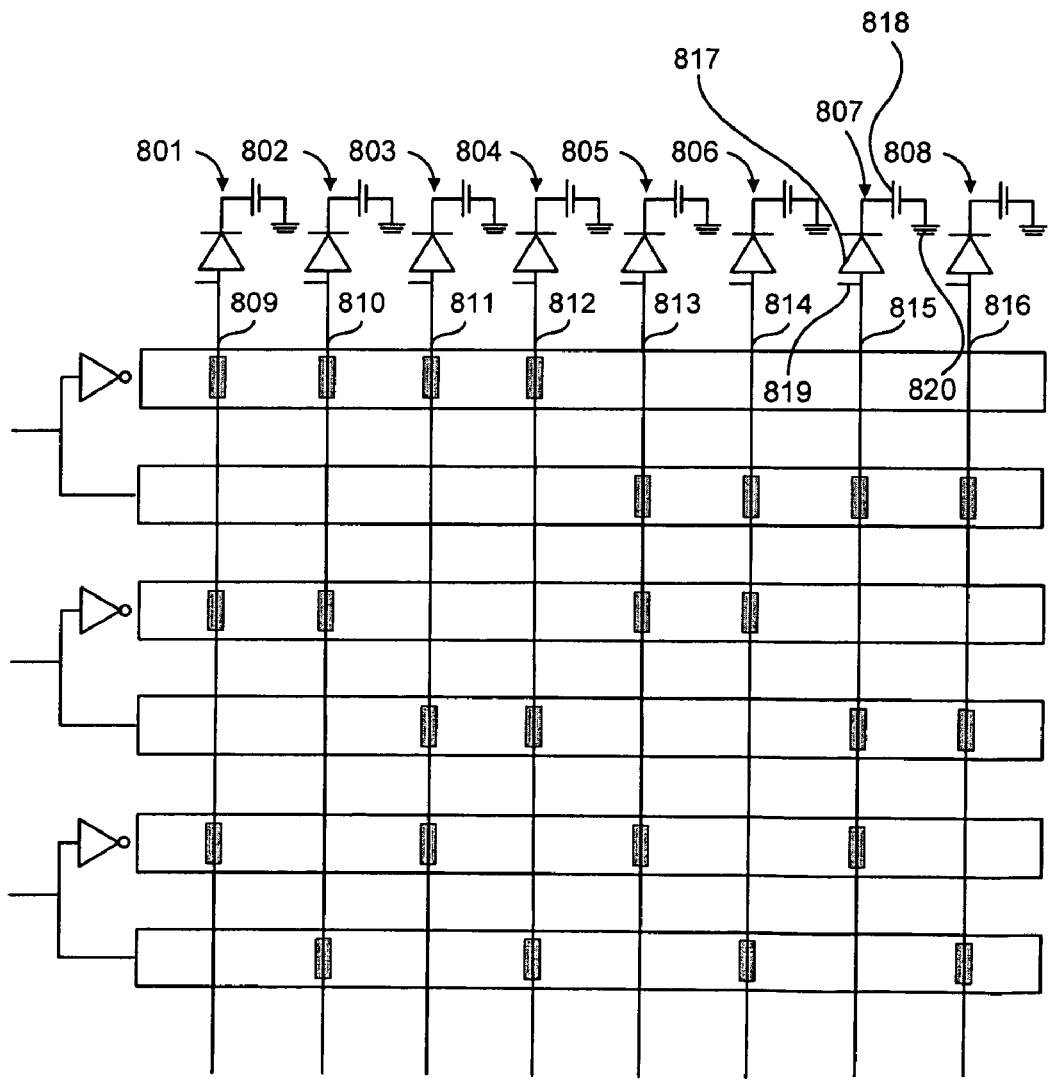

FIG. 8 illustrates binary signal converters appended the end of each multiplexer/demultiplexer nanowire, that represents one or many possible embodiments of the present invention.

Figure 9:
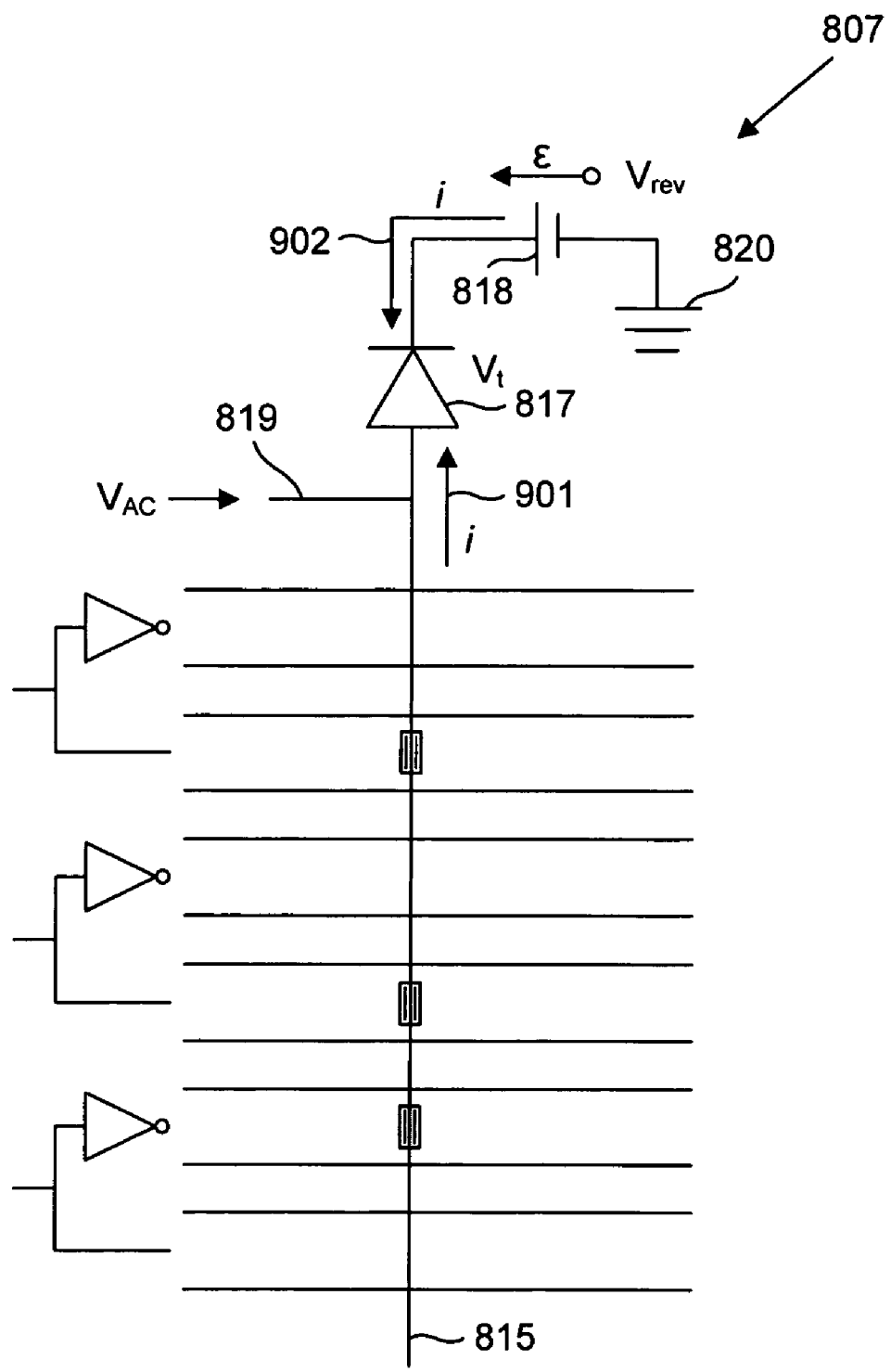

FIG. 9 illustrates an enlargement of a binary signal converter shown in FIG. 8, that represents one of many possible embodiments of the present invention.

Figure 10:
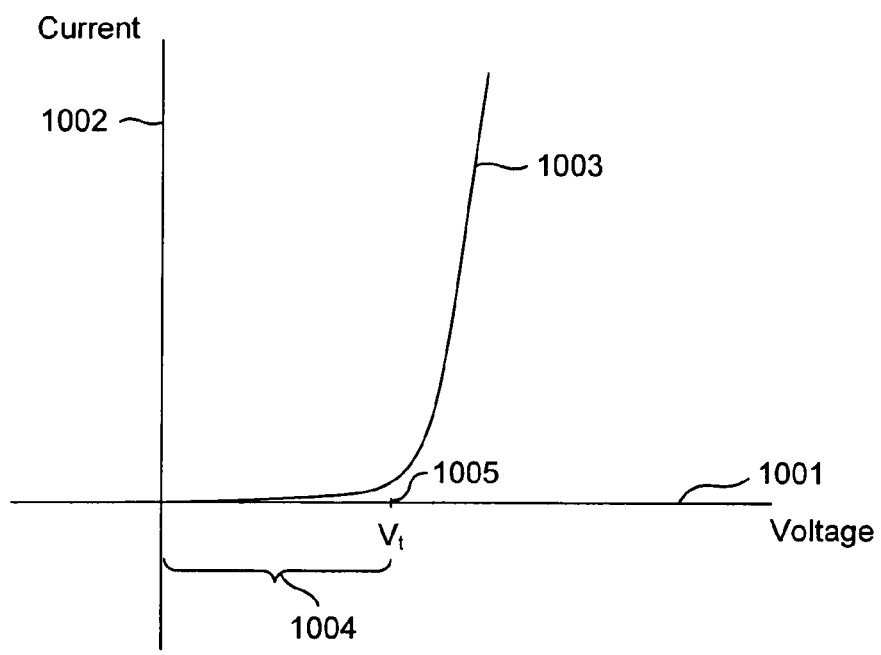

FIG. 10 conceptually illustrates operation of a diode, shown in FIG. 9.

Figure 11:
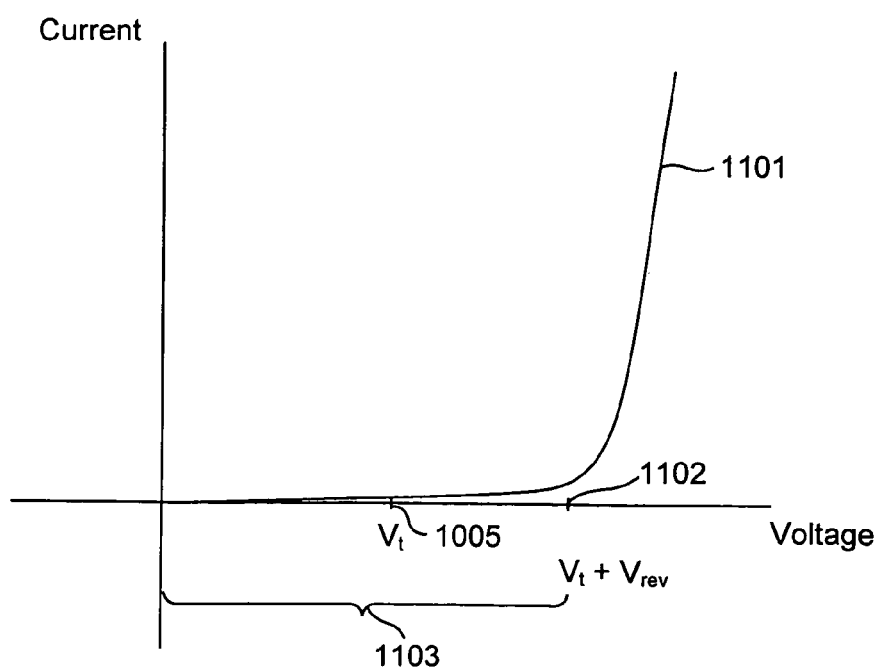

FIG. 11 conceptually illustrates operation of a diode, shown in FIG. 9, under a reverse bias.

Figure 12:
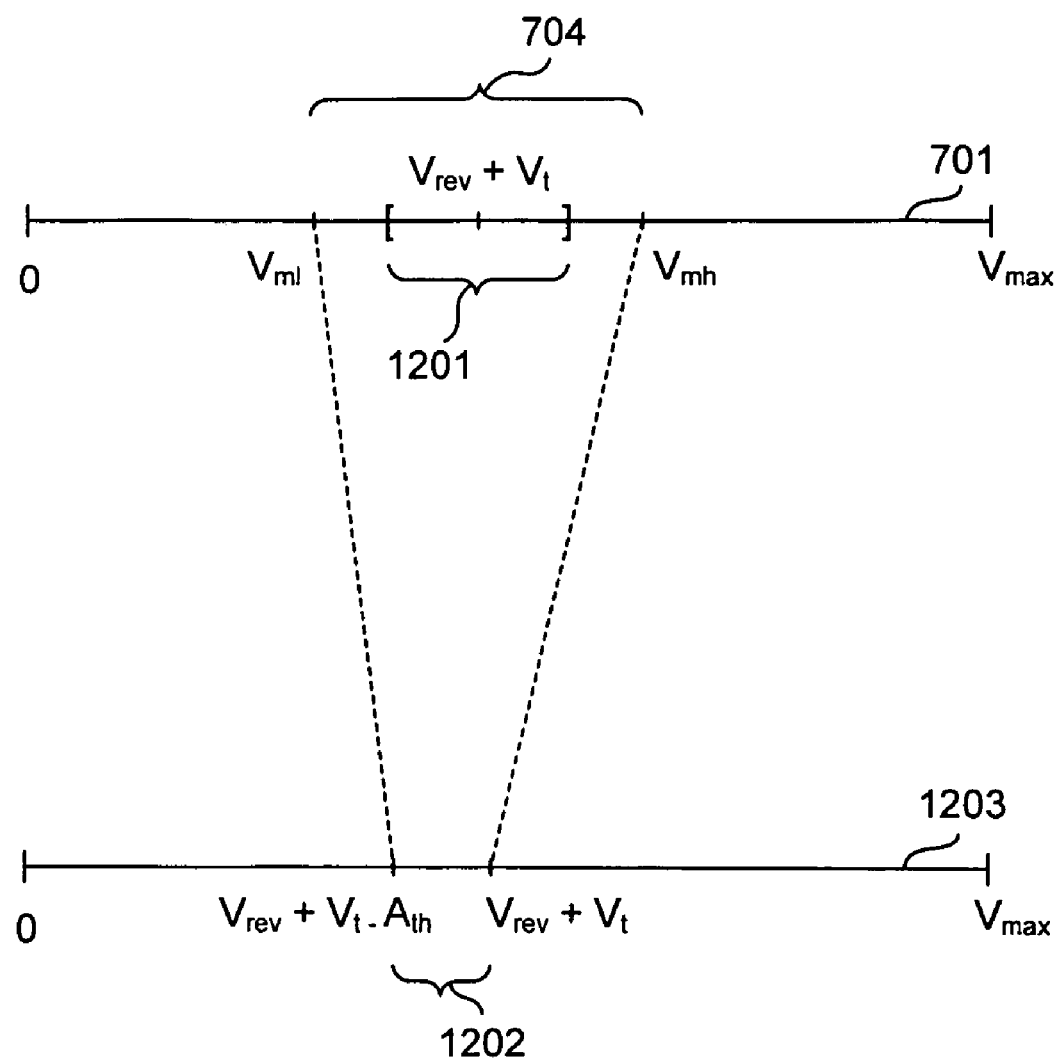

FIG. 12 illustrates a modified gray-scale signal range, that represents one of many possible embodiments of the present invention.

FIGS. 13A-13D are voltage versus time plots for example oscillating voltages on a nanowire, each representing an embodiment of the present invention.

DETAILED DESCRIPTION OF THE INVENTION

As discussed below, nanowire crossbars represent one of a number of emerging nanoscale technologies that can be used to construct nanoscale electronic devices, such as multiplexer/demultiplexers. Multiplexer/demultiplexer nanowires often carry voltage signals comprising relatively high-voltage and low-voltage states corresponding to the binary values "1" and "0," respectively. The relatively high voltage is generally readily distinguishable from the relatively low voltage. However, if the voltage in a wire falls between the high voltage and the low voltage, the binary value represented by the voltage may be indeterminate, leading to subsequent, indeterminate logic output values.

Various embodiments of the present invention are directed to multiplexer/demultiplexer designs that produce readily distinguishable, binary signals. The present invention is described below in two subsections: (1) an overview of nanowire crossbars, and (2) a discussion of several embodiments of the present invention.

Overview of Nanowire Crossbars

Figure 1:
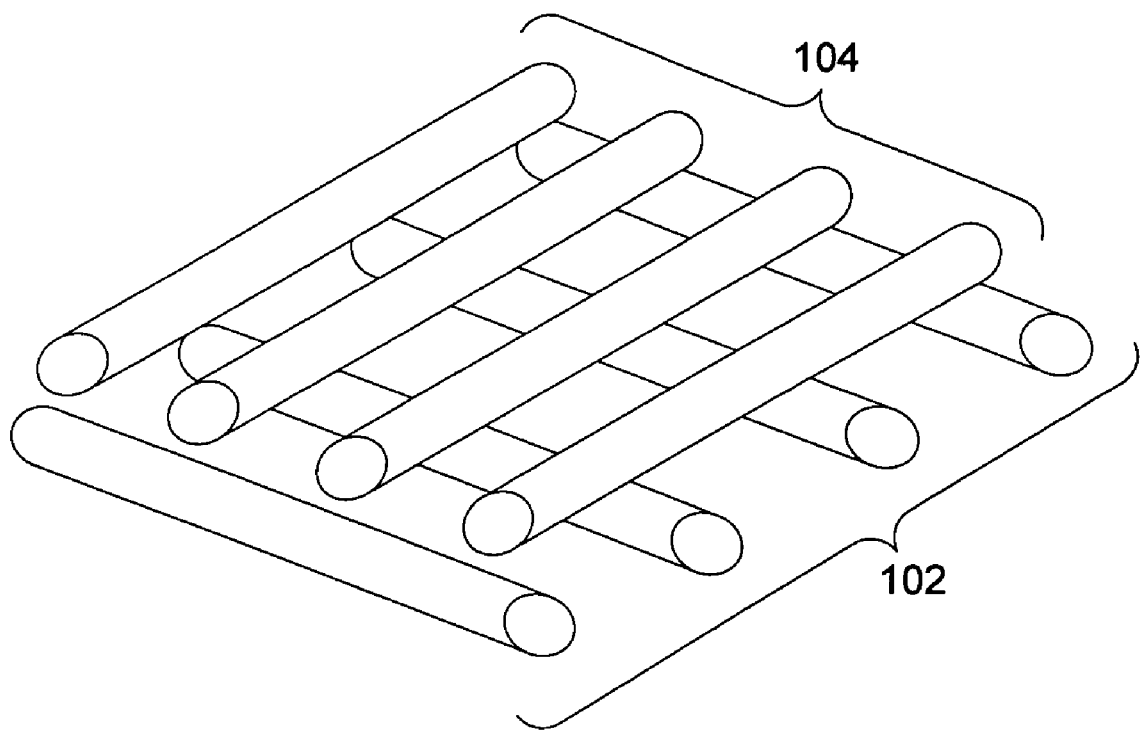
FIG. 1 illustrates a nanowire crossbar.

A relatively new and promising technology for manufacturing electronic devices involves nanowire crossbars. FIG. 1 illustrates a nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at nanowire intersections that represent the closest contact between two nanowires. Note that the term "nanowire crossbar" may refer to crossbars having one or more layers of sub-microscale, microscale, or larger wires in addition to nanowires.

Nanowires can be fabricated using mechanical nanoscale imprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale signal-wire leads or other electronic leads through a variety of different methods to incorporate the nanowires into electrical circuits.

Figure 2:
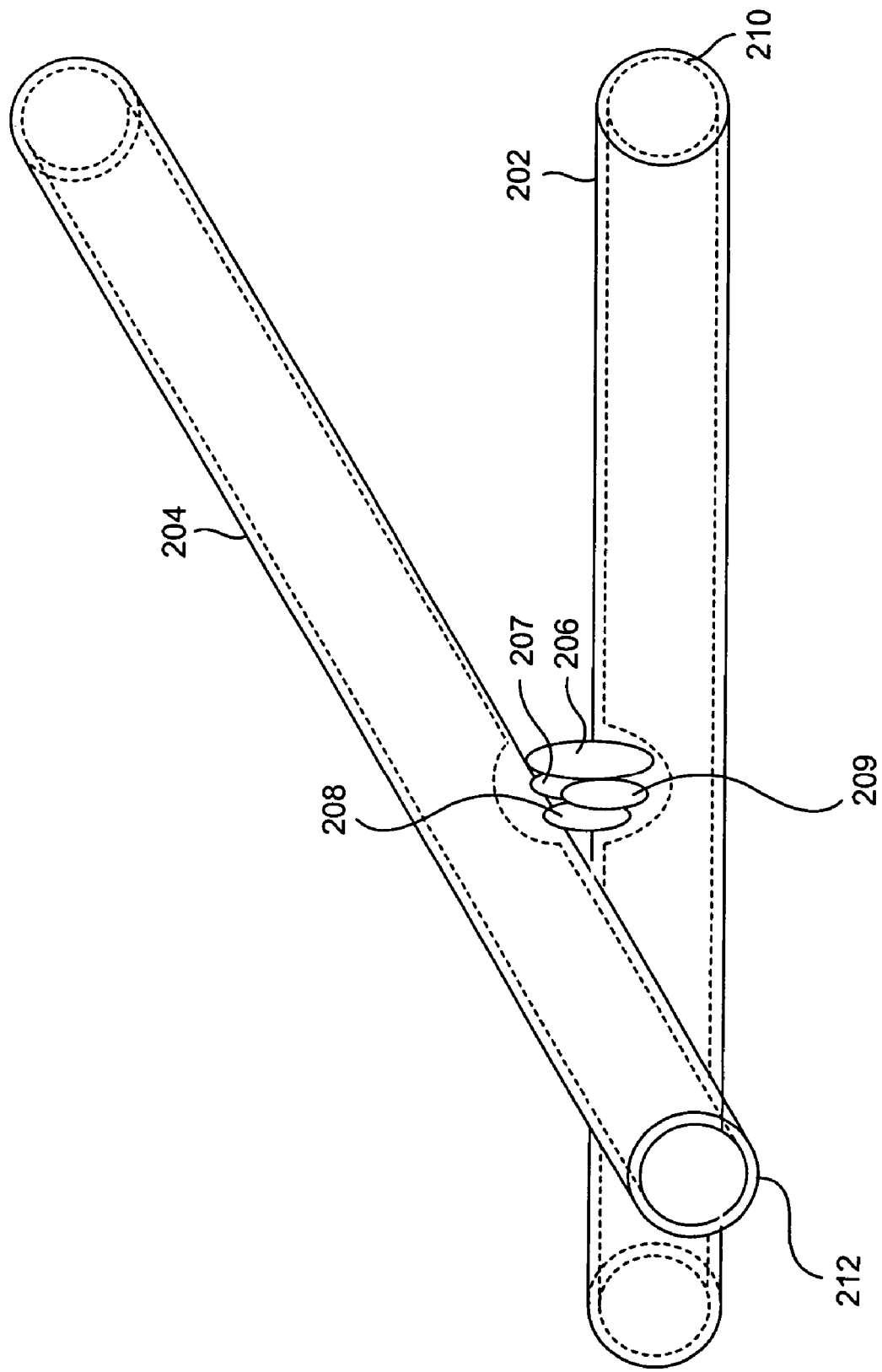
FIG. 2 illustrates a nanowire junction between two roughly orthogonal nanowires.

Nanowire crossbars may be used to create arrays of nanoscale electrical components, such as transistors, diodes, resistors, and other familiar basic electrical components. FIG. 2 illustrates a nanowire junction that interconnects nanowires 202 and 204 of two contiguous layers within a nanowire crossbar. Note that the nanowire junction may or may not involve physical contact between the two nanowires 202 and 204. As shown in FIG. 2, the two nanowires are not in physical contact at their overlap point, but the gap between them is spanned by a small number of molecules 206-209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires interconnected by a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire-junction molecules, and uniform orientation of the nanowire-junction molecule with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, and/or may serve as modulation-dopant-layers, which can be selectively activated to dope semiconductor nanowires. Both p-type and n-type modulation dopant coatings have been developed. In other applications, the molecules spanning nanowire junctions between overlapping nanowires may be introduced as a separate layer, referred to as "intermediate layer," formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

One type of nanowire junction that can be configured behaves as if it were a resistor in series with a switch that may be opened or closed. When the switch is closed, the nanowire-junction molecule connects the overlapping nanowires at the nanowire junction. When the switch is open, the nanowire junction molecule spanning the nanowire junction has no effect on the current.

Figure 3A:
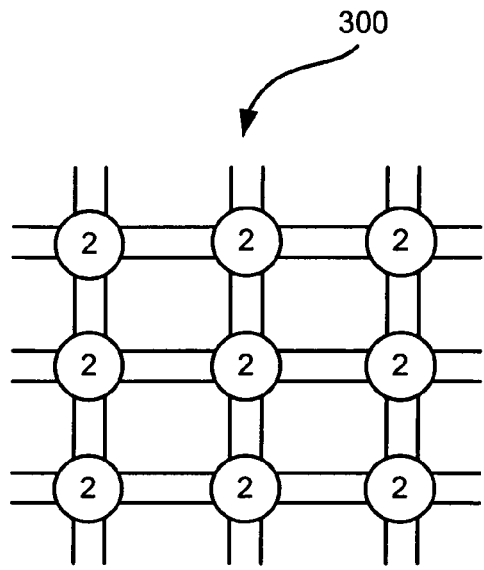
FIGS. 3A-3D illustrate one of many possible approaches for configuring a network of nanoscale electrical components from a two-layer nanowire crossbar.
Figure 3B:
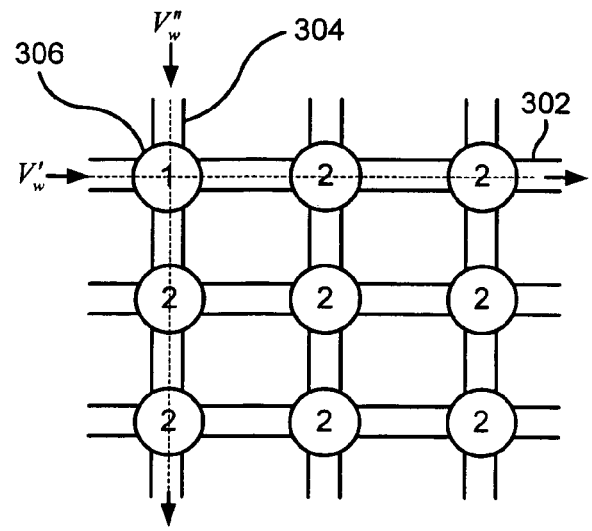
Figure 3C:
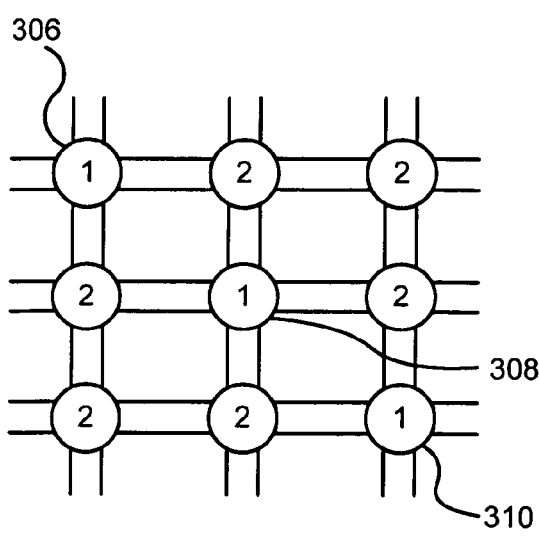
Figure 3D:
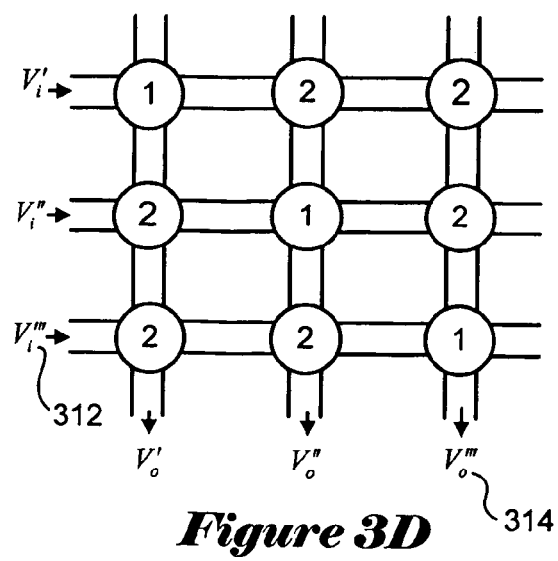

Nanowire junctions can be configured electrically, optically, mechanically or by other means. FIG. 3 illustrates one possible approach to configuring a network of reconfigurable nanoscale electrical components from a two-layer nanowire crossbar. In FIGS. 3A-3D, a small 3×3 nanowire crossbar is shown, with circles at all nine nanowire junctions that indicate the state of the nanowire-junction molecules. In one state, labeled "1" in FIGS. 3A-3D, the nanowire-junction molecules may have certain semiconductor, or conductive properties, while in a second state, labeled "2" in FIGS. 3A-3D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a WRITE voltage, or configuring voltage, to the nanowires that form the nanowire junction in order to configure, or program, the nanowire junction to have the state "1." For example, in FIG. 3B, a first WRITE voltage $v_w'$ is applied to horizontal nanowire 302 and a second WRITE voltage $v_w''$ is applied to vertical nanowire 304 to change the state of the nanowire junction 306 from "2" to "1." Individual nanowire junctions may be configured through steps similar to the steps shown in FIG. 3B, resulting finally in a fully configured nanoscale component network as shown in FIG. 3C. Note that, in FIG. 3C, the states of nanowire junctions 306, 308, and 310, forming a downward-slanted diagonal through the nanowire crossbar have been configured by selective application of WRITE voltages. Finally, as shown in FIG. 3D, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the WRITE voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
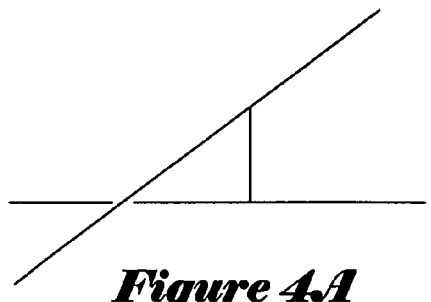
Figure 4B:
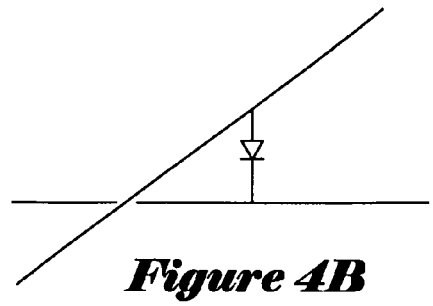
Figure 4C:
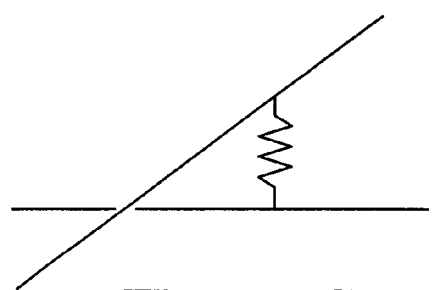
Figure 4D:
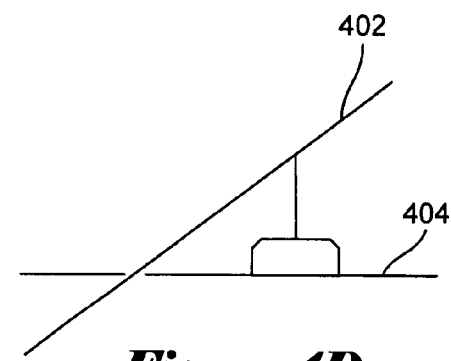
Figure 4E:
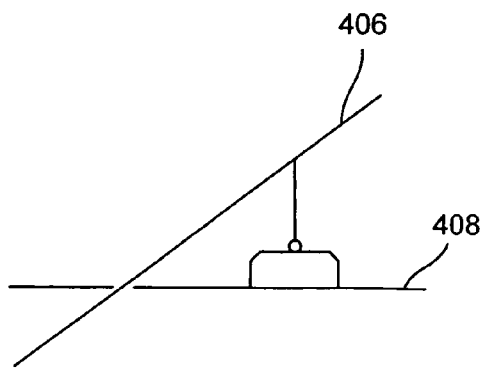
Figure 4F:
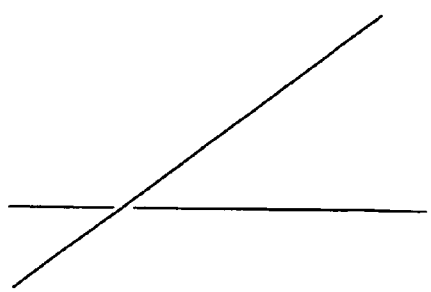

Nanowire junctions in nanowire crossbars may be configured, in various techniques depending on the chemical nature of the nanowires and nanowire-junction-spanning molecules, to form a wide variety of different, simple electrical components. FIG. 4 schematically illustrates a number of simple electrical components that can be configured at nanowire junctions in nanowire crossbars. A nanowire junction may represent (1) a simple conductive connection between two nanowires, as shown in FIG. 4A; (2) a diode that conducts current in only one direction between two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the overlapping of two conductive nanowires, with the voltage and current associated with each nanowire completely independent from one another, as shown in FIG. 4F.

The nFET and pFET electrical components perform switch operations, controlled by the signal level placed on gate wires, that can either enable or disable source/drain wires. An enabled source/drain wire allows current to flow beyond the nFET or pFET electrical component, and the flow of current beyond the nFET or pFET electrical component is not allowed in a disabled source/drain wire. However, nFETs and pFETs exhibit opposite behavior based on the signal level applied to the gate wires. In the case of the nFET, shown in FIG. 4D, a relatively low signal on the gate nanowire 402 causes the nFET to disable source/drain nanowire 404, while a relatively high signal on gate nanowire 402 causes nFET to enable source/drain nanowire 404. By contrast, in the case of the pFET, shown in FIG. 4E, a relatively low signal on gate nanowire 406 causes the pFET to enable source/drain nanowire 408, and a relatively high signal on gate nanowire 406 causes the pFET to disable source/drain nanowire 408. Note that a electrical component may also be configured as an insulator, essentially interrupting conduction at the electrical component with respect to both overlapping nanowires.

Thus, as discussed above with reference to FIGS. 1-4, a two-dimensional nanowire crossbar may be fabricated and then configured as a network of electrical components. Note also that a nanowire junction, although shown in FIGS. 4A-4F to comprise the nanowire junction of two single nanowires, may also comprise a number of nanowire junctions between a number of nanowires in a first layer of a nanowire crossbar that together comprise a single conductive element and the nanowires in a second nanowire layer that together comprise a second conductive element.

The configurable electrical resistances of nanowire junctions are important and special properties of certain types of nanowire junctions. When certain types of molecules are used for nanowire junctions, the initially relatively high resistances of the nanowire junctions may be lowered by applying relatively large positive voltages to the nanowire junctions. The resistances of the nanowire junctions may be a function of the magnitude of the highest voltages applied to the nanowire junction. By applying higher and higher positive voltages to a nanowire junction, the resistance of the nanowire junction may be made lower and lower. A relatively low resistive state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Note that the term "signal" refers to a detectable low or high physical quantity, such as voltage or current, transmitted by nanowire-crossbar wires. The terms "low" and "high" generally refer to a range of values associated with a signal. For example, a signal that ranges between no signal and a signal threshold may be called a "low signal," and any signal above the signal threshold is called a "high signal." A low signal is represented by the bit value "0," and a high signal is represented by the bit value "1."

A particularly useful type of nanowire crossbar is a multiplexer/demultiplexer. Multiplexer/demultiplexers can be used to address nanowires. FIG. 5A illustrates an exemplary nanowire-crossbar multiplexer/demultiplexer. In FIG. 5A, vertical lines 501-508 represent a first layer of approximately parallel nanowires, while horizontal bars 509-514 represent a second overlapping layer of approximately parallel horizontal address wires. Note that the address wires in FIG. 5A can be of nanoscale, sub-microscale, microscale, or greater dimensions and can be composed of conductor material or semiconductor material. The shaded rectangles, such as shaded rectangle 515 represent electrical components that interconnect address wires with nanowires. The electrical components can be resistors, conductive links, diodes, or FETs, as described above with reference to FIGS. 4A-4F.

In FIG. 5A, a pattern of electrical components is fabricated at selected nanowire junctions. The electrical-component pattern ensures that each nanowire is uniquely interconnected with three of the six address wires. For example, electrical components 515-517 interconnect nanowire 507 with address wires 510, 512, and 513, respectively, and no other nanowire is interconnected to all three address wires 510, 512, and 513. A nanowire that receives three high signals via three address wires is said to be "addressed," and carries a resulting signal that represents the bit value "1."

The remaining nanowires that are not addressed, or selected, are assigned the bit value "0." For example, if address wires 510, 512, and 513 carry high signals, then nanowire 507 is the only nanowire receiving three separate high signals, and, therefore, nanowire 507 is selected to carry a high voltage representing the bit value "1," while the remaining nanowires carry a low voltage representing the bit value "0."

Nanowires 501-508 each have a unique 3-bit binary-code address represented by $A_1A_2A_3$, where $A_1$, $A_2$, and $A_3$ each represents an independent high or low input signal. Input lines 518-520 carry input signals $A_1$, $A_2$, and $A_3$ to address wires 509-514. Note that input lines 518-520 each branch to one pair of address wires. For example, input line 518 branches to the pair of address wires 509 and 510. One address wire of each pair is inverted with respect to the other address wire of the pair. For example, NOT gate 521 inverts input signal $A_1$ to $\overline{A}_1$, carried on address wire 509, while signal $A_1$ is carried on address wire 510. The pair of address wires 509 and 510 is referred to as a "complementary pair of address wires."

In FIG. 5A, each nanowire is addressed according to a unique pattern of high and low input signals $A_1$, $A_2$, and $A_3$. The electrical-component pattern ensures that no two nanowires have identical addresses by interconnecting each nanowire with a unique set of three address wires. For example, if the input signals $A_1$, $A_2$, and $A_3$ supply high, high, and low signals, respectively, then address wires 510, 512, and 513 carry high signals to nanowire 507 via electrical components 515-517. Nanowire 507 is the only nanowire interconnected with address wires 510, 512, and 513, and, thus, the only nanowire receiving three high signals. The 3-bit binary-code address for nanowire 507 is "110." FIG. 5B shows a table summarizing the 3-bit addresses associated with nanowires 501-508.

In general, a binary-code multiplexer/demultiplexer, such as the binary-code multiplexer/demultiplexer shown in FIG. 5A, employs n input lines to uniquely address $2^n$ nanowires. For example, the multiplexer/demultiplexer described above with reference to FIG. 5A uses only three external communication wires to address $2^3$, or eight nanowires.

Typically, multiplexer/demultiplexer-nanowire junctions are composed of two-way AND logic gates. FIG. 6A illustrates a two-way AND logic gate. In FIG. 6A, two-way AND logic gate 601 accepts input signals A and B and produces output signal AB. The output signal is represented by the product AB, because a two-way AND gate performs the Boolean algebra equivalent operation of multiplication on the input signals. Thus, if both input signals A and B are high, or have the binary value "1," then the output signal AB is high, and if either or both input signals A or B are low, or have the binary value "0," then the output signal AB is low. FIG. 6B illustrates a truth table summarizing input signal combinations and corresponding output signals for the two-way AND logic gate shown in FIG. 6A.

FIG. 6C illustrates an exemplary two-way AND logic gate that employs pFETs to realize the two-way AND logic gate described above with reference to FIGS. 6A-6B. In FIG. 6C, a high signal, denoted by $V_{in}$, passes through resistor 602 to wire 603. Signal $V_{in}$ can be passed from wire 603 to either or both grounds 604 and 605, depending on whether input signals A and B enable or disable the signal paths controlled by pFETs 606 and 607. For example, if input signal A is low, then pFET 606 enables signal to pass to ground 604 pulling $V_{in}$ down to a low output signal $V_{out}$. On the other hand, if both input signals A and B are high, then pFETs 606 and 607 are disabled, and $V_{in}$ is not able to pass to either ground 604 or 605, providing a high output signal $V_{out}$. Note that two-way AND logic gates can also be fabricated using nFETs or diodes.

Embodiments of the Present Invention

Voltage signals within electronic devices are generally binary, with a high voltage representing binary value "1," and a low voltage representing binary value "0," although alternative conventions can be used. In general, binary value "0" corresponds to a range of voltages between a low voltage minimum and a low voltage maximum, and binary value "1" corresponds to a range of voltages between a high voltage minimum and a high voltage maximum. However, nanoscale electrical components, such as transistors and diodes, fabricated at nanowire junctions may fail to provide output signals that fall within the ranges of voltages corresponding to binary values "0" and "1." As a result, certain multiplexer/demultiplexer nanowires may have voltages that fall into an intermediate-voltage range, called the "gray-scale-voltage range," located between the low voltage maximum and the high voltage minimum.

FIG. 7 shows an exemplary voltage axis that can be used to determine binary values of multiplexer/demultiplexer nanowires. In FIG. 7, line 701 represents a positive-voltage axis that displays a range of voltages. Low-voltage range 702 ranges from a low voltage minimum, denoted by $V_{min}$, to a low voltage maximum, denoted by $V_{ml}$, while high-voltage range 703 ranges from a high voltage minimum, denoted by $V_{mh}$, to a high voltage maximum, denoted by $V_{max}$. If a nanowire voltage is within low-voltage range 702, the nanowire has the binary value "0," and if a nanowire voltage is within high-voltage range 703, the nanowire has the binary value "1." Low-voltage-range maximum, $V_{ml}$, and high-voltage-range minimum, $V_{mh}$, define lower and upper limits, respectively, of a gray-scale-voltage range 704. Nanowires having voltages in gray-scale-voltage range 704 may be indeterminate.

In one embodiment of the present invention, a binary signal converter is attached to the end of a multiplexer/demultiplexer nanowire to assign an appropriate bit value to the nanowire. FIG. 8 illustrates binary signal converters appended to the ends of multiplexer/demultiplexer nanowires, that represents one of many possible embodiments of the present invention. In FIG. 8, binary signal converters 801-808 are each composed of a diode, a reverse-bias source, an alternating-voltage-source wire, and a connection to ground. For example, binary signal converter 807 is composed of diode 817, reverse-bias source 818, alternating-voltage-source wire 819, and connection to ground 820. The alternating-voltage-source wires, such as alternating-voltage-source wire 819, are connected to an alternating-voltage source, not shown, that places an alternating voltage on each nanowire. Note that each diode contains a cathode end that emits current and an anode end that receives current. In FIG. 8, the diode-anode ends are connected to the nanowire ends and the diode-cathode ends are connected to the reverse-bias sources.

FIG. 9 illustrates an enlargement of binary signal converter 807 appended to nanowire 815 shown in FIG. 8, that represents one of many possible embodiments of the present invention. An alternating voltage, denoted by $V_{AC}$, is applied to nanowire 815 on alternating-voltage-source wire 819. Diode 817 allows current to flow in a forward direction but not in the opposite reverse direction. In general, current flows through a diode from the anode end to the cathode end. For example, diode 817 allows current to flow from the anode end attached to nanowire 815 to the cathode end leading to reverse-bias source 818, as indicated by current arrow 901. When a diode allows current to flow from the anode end to the cathode end, the diode is in a low resistance state and said to be "forward biased." For example, diode 817 is forward biased in the direction indicated by current arrow 901. Note that the term "forward bias" refers to a voltage applied in the direction a diode allows current to flow. Reverse-bias source 818 applies a voltage, denoted by $V_{rev}$, in the direction indicated by current arrow 902 that reverse-biases diode 817. The reverse bias is a voltage applied across a diode that increases the resistance in the forward direction. A diode in a high resistance state due to a reverse bias is said to be "reversed biased."

Typically, in the absence of a reverse bias, a diode does not allow current to flow in the forward direction unless the voltage applied in the forward direction is greater than a forward-bias threshold, denoted by $V_f$. If the voltage applied to the diode is less than the forward-bias threshold, the diode resistance is high and little current flows through the diode in the forward direction, but if the voltage applied to the diode is greater than the forward threshold, the diode resistance is lowered and significant current flows through the diode in the forward direction, the amount of current dependent on the forward voltage applied to the diode.

FIG. 10 illustrates operation of diode 817, shown in FIG. 9. In FIGS. 10 and 11, horizontal lines, such as horizontal line 1001, represents the voltage axis, while vertical lines, such as vertical line 1002, represent the current axis. Curve 1003 represents the amount of current flowing through diode 817 in the forward direction. If a voltage applied to diode 817 is less than forward-bias threshold 1005, the resistance of diode 817 is high and a very small amount of current passes, as indicated by the nearly zero current in region 1004. However, if a voltage applied to diode 817 is greater than forward-bias threshold 1005, the resistance of diode 817 is lowered and significant current passes, as indicated by the steep increase in curve 1003 for voltage levels greater than forward-bias threshold 1005.

Note that the forward-bias threshold can be increased by applying a reverse bias to the diode. For example, in FIG. 9, reverse-bias source 818 places a reverse bias on diode 817. As a result, the forward-bias threshold of diode 817 is increased.

FIG. 11 illustrates operation of diode 817, shown in FIG. 9, under a reverse bias. In FIG. 11, curve 1101 represents the amount of current flowing through diode 817 in the forward direction. Note that forward-bias threshold 1005 is increased by the magnitude of the reverse bias, $V_{rev}$, supplied by reverse-bias source 818. In other words, the voltage applied to diode 817 in the reverse-bias direction by reverse-bias source 818 shifts forward-bias threshold 1005 in the forward direction to modified-forward-bias threshold 1102. In order for current to freely flow through diode 817, the forward bias applied to nanowire 815 needs to be greater than modified-forward-bias threshold 1102. For example, if a voltage applied to diode 817 in the forward direction is less than modified-forward-bias threshold 1102, the resistance of diode 817 remains high and very little current is allowed to flow through diode 817, as indicated by nearly zero current in region 1103. However, if the voltage applied to diode 817 is greater than modified-forward-bias threshold 1102, the resistance of diode 817 is lowered and significant current passes, as indicated by the steep increase in curve 1103 for voltages greater than modified-forward-bias threshold 1102.

Modified-forward-bias thresholds are set, in the multiplexer/demultiplexer representing one embodiment of the present invention, by applying a reverse bias, $V_{rev}$, according to the following condition:

$$V_{ml} < V_{rev} + V_t < V_{mh} \quad \text{Condition 1:}$$

Next, an alternating current is applied to the nanowires. The alternating current corresponds to an alternating voltage that oscillates between $\pm V_{AC}$ and satisfies the following condition:

$$V_{ml} < V_{rev} + V_t \pm V_{AC} < V_{mh} \quad \text{Condition 2:}$$

Note that applying an alternating voltage to a nanowire already carrying a constant voltage $V_{DC}$ results in a superimposed oscillating voltage that oscillates in a voltage interval given by:

$$V_{DC} \pm V_{AC}$$

The binary value of the nanowire is determined by detecting the presence of an oscillation in the nanowire voltage. If an oscillating voltage is detected on a nanowire, the nanowire has the binary value "0," and if no oscillating voltage is detected on a nanowire, the nanowire has the binary value "1." Note that, in general, detecting an oscillating voltage on a nanowire can be accomplished more quickly than measuring a constant-voltage.

The device that detects oscillating voltages on a nanowire, such as voltmeter, ammeter, or potentiometer, may have a threshold amplitude, denoted by $A_{th}$, for detecting oscillations in the voltages carried by the nanowires. For example, if a nanowire carries an oscillating voltage with an amplitude less than $A_{th}$, then an oscillation in the voltage carried by the nanowire cannot be detected, and if a nanowire carries an oscillating voltage with an amplitude greater than $A_{th}$, then an oscillation in the voltage carried by the nanowire can be detected. Selecting $V_{AC}$ equal to or less than the threshold amplitude reduces the size of the gray-scale signal range.

FIG. 12 illustrates a modified gray-scale signal range, that represents one of many possible embodiments of the present invention. In FIG. 12, axis 701 and gray-scale signal range 704 are reproduced, as described above with reference to FIG. 7. Note that interval 1201 represents a voltage interval given by Condition 2 as follows:

$$(V_{rev} + V_t - V_{AC}, V_{rev} + V_t + V_{AC})$$

Setting $V_{AC}$ equals the threshold amplitude, $A_{th}$, for the voltage detection device, reduces gray-scale signal range 704 to modified gray-scale signal range 1202 on voltage axis 1203. Note that $V_{AC}$ can be set to values greater than or less than threshold amplitude $A_{th}$.

Figure 13A:
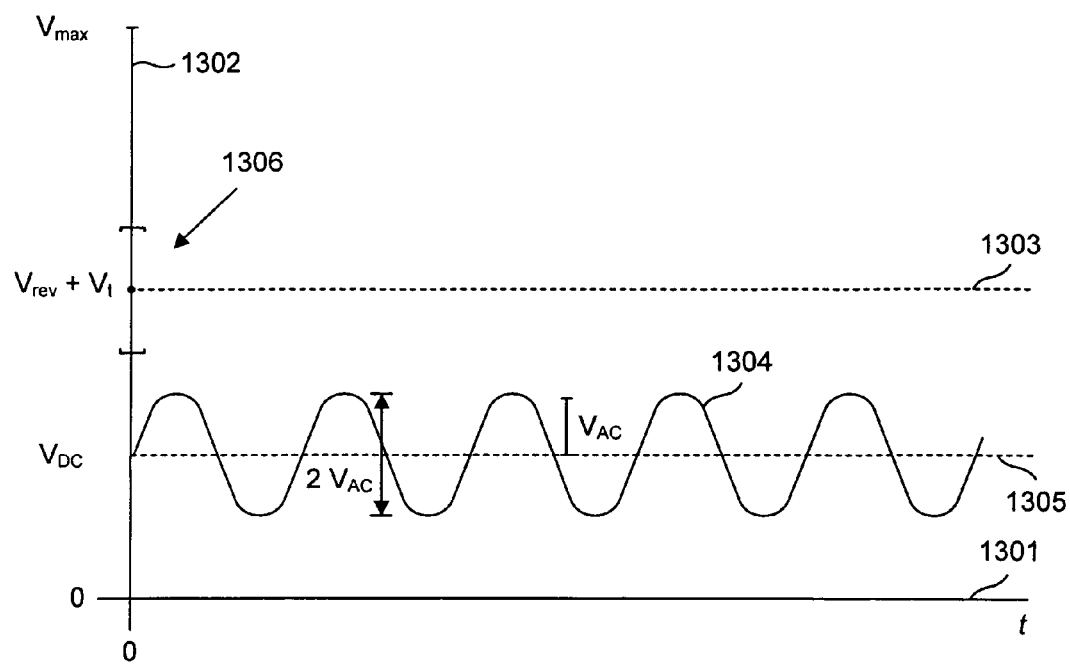

FIGS. 13A-13D are voltage versus time plots for example oscillating voltages on a nanowire, each representing an embodiment of the present invention. In FIGS. 13A-13D, horizontal lines, such as horizontal line 1301 in FIG. 13A, represent time axes, while vertical lines, such as vertical line 1302 in FIG. 13A, represent voltage axes 1201, as described above with reference to FIG. 12. Dashed lines, such as dashed line 1303 in FIG. 13A, identifies the modified-forward-bias threshold provided by Condition 1. Sinusoidal curves, such as sinusoidal curve 1304 in FIG. 13A, represent oscillating voltages, where the amplitude $V_{AC}$ equals the threshold amplitude $A_{th}$. The constant-voltage component, $V_{DC}$, determines the equilibrium of the three oscillating voltages, each with an amplitude $V_{AC}$. For example, in FIG. 13A, dashed line 1305 represents the constant voltage component, $V_{DC}$, that determines the equilibrium of oscillating voltage 1304 with amplitude $V_{AC}$. Square-bracketed region 1306 identifies a voltage range, such as voltage range 1201 described above with reference to FIG. 12.

FIG. 13A illustrates a hypothetical oscillating voltage having a constant-voltage component 1305 that is less than modified-forward-bias threshold 1303. As a result, the full oscillating-superimposed signal 1304 is less than modified-forward-bias threshold 1303 and the resistance of the diode remains high. The oscillating votlage does not pass to ground through the binary signal converter and is detectable on the nanowire. A nanowire with a detectable oscillating voltage therefore has the binary value "0."

Figure 13B:
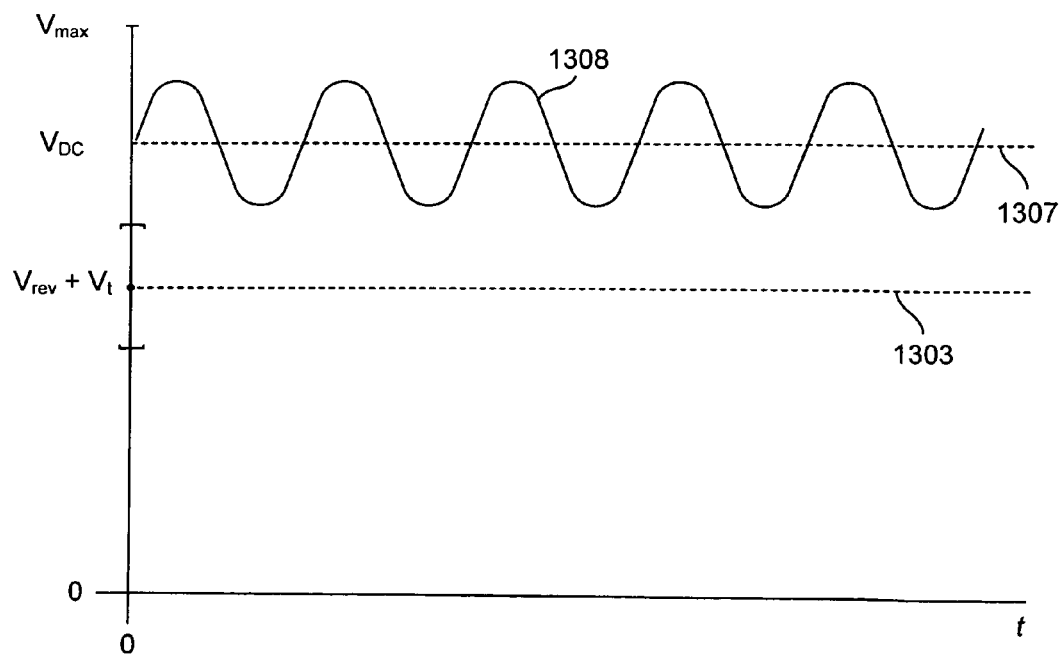

FIG. 13B illustrates a hypothetical oscillating voltage having a constant-voltage component 1307 that is greater than the high-signal range. As a result, the full oscillating voltage 1308 is greater than modified-forward-bias threshold 1303. The resistance of the diode is lowered and the oscillating voltage leaks to ground. A nanowire without a detectable oscillating voltage has the binary value "1."

Figure 13C:
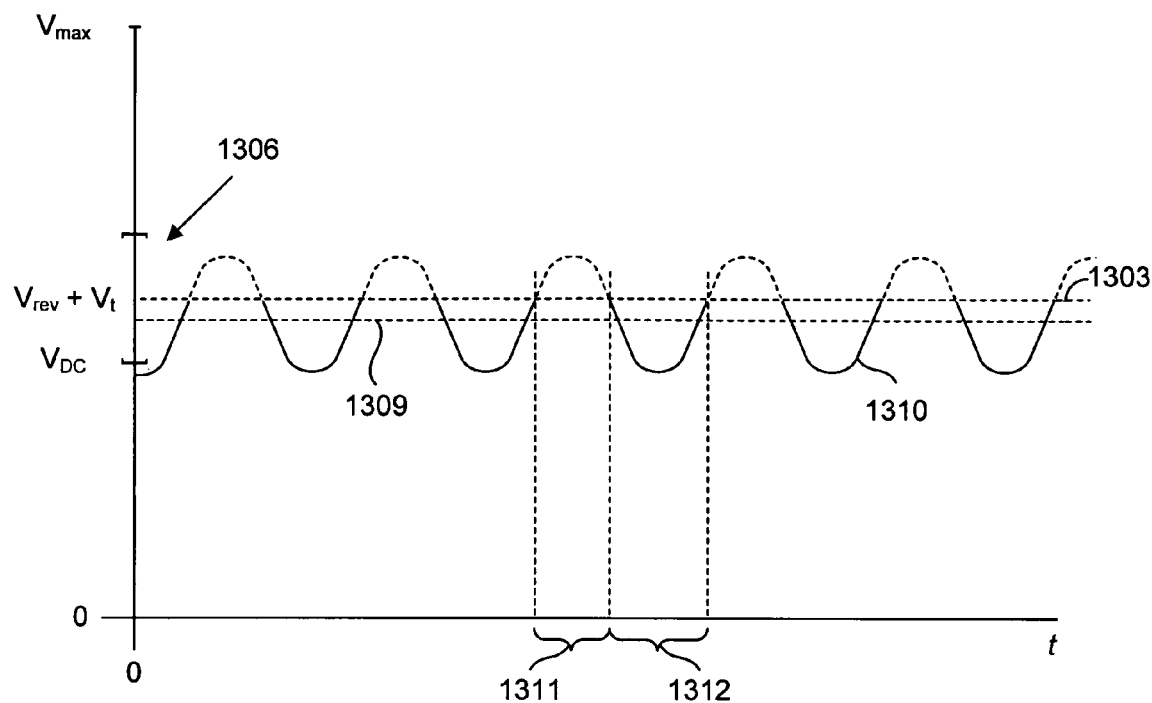
Figure 13D:
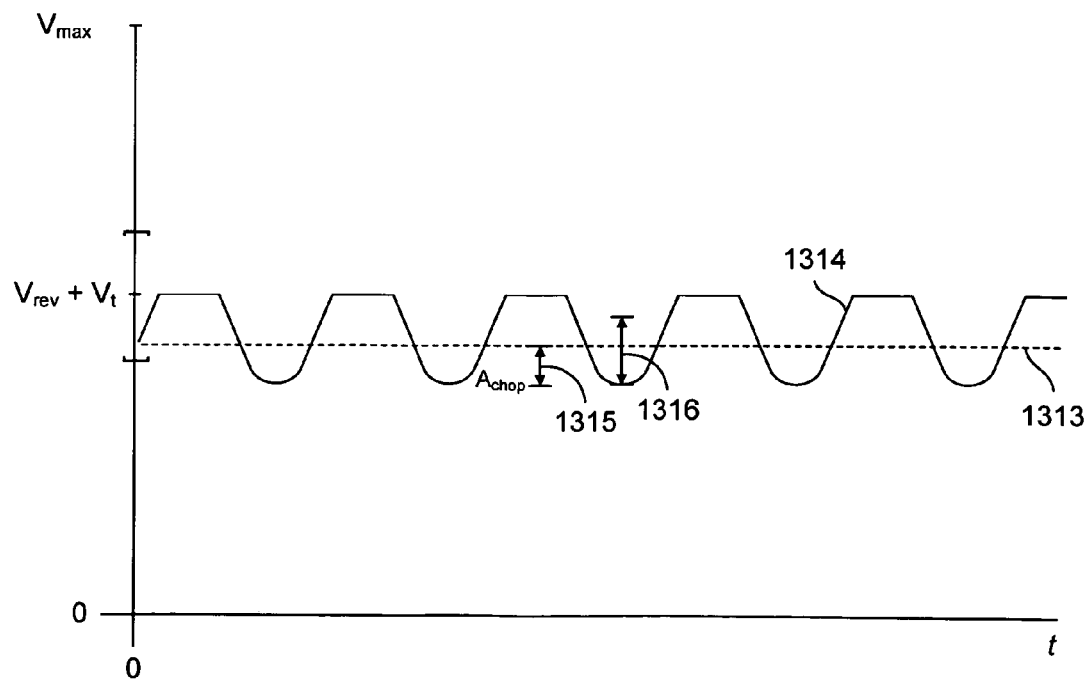

FIGS. 13C-13D illustrates a hypothetical oscillating voltage having a constant-voltage component 1309 that falls within voltage range 1306. The dashed-line portion of oscillating voltage 1310 identifies time durations where the oscillating voltage is greater than modified-forward-bias threshold 1303. As a result, the diode resistance is lowered for portions of oscillating voltage 1310 that are greater than modified-forward-bias threshold 1303 and the portions leak to ground, while the diode resistance remains high for portions of oscillating voltage 1310 that are less than diode threshold 1303 and the voltage remains on the nanowire. For example, during time duration 1311, the diode resistance is lowered allowing the corresponding dashed-line portion of oscillating voltage 1310 to leak to ground. By contrast, during time duration 1312 the corresponding portion of oscillating voltage 1310 remains on the nanowire. As a result, the amplitude of oscillating voltage 1310 is reduced. FIG. 13D illustrates the hypothetical reduced amplitude oscillating voltage described above with reference to FIG. 13C. Dashed-line 1313 identifies the equilibrium of reduced amplitude oscillating voltage 1314 that remains on the nanowire. Interval 1315 identifies the reduced amplitude, denoted by $A_{chop}$, of oscillating voltage 1314. Note that because the amplitude $A_{chop}$ is less than threshold amplitude 1316 the nanowire has a binary value "0."

Although the present invention has been described in terms of an embodiment, it is not intended that the invention be limited to the above described embodiment. Modifications within the spirit of the invention will be apparent to those skilled in the art.

For example, in an alternate embodiment, a single binary signal converter may be employed to distinguish the signals carried by the nanowires. In an alternate embodiment, other electrical components or combinations of electrical components can be employed other than diodes to filter signals carried by the nanowires.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings.

The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A binary signal converter that facilitates distinguishing an original direct signal on a nanowire by superimposing an alternating signal on the original direct signal, the binary signal converter comprising:
    an alternating signal source connected to the nanowire that superimposes an alternating signal with an initial amplitude on the nanowire; and
    a selective alternating signal filter that selectively passes the alternating signal from the nanowire to a signal sink.

2. The binary signal converter of claim 1 wherein the original direct signal and the alternating signal are each one of a voltage signal or a current signal.

3. The binary signal converter of claim 1 wherein the alternating signal source further comprises an alternating signal source wire that connects the alternating signal source to the nanowire.

4. The binary signal converter of claim 1 wherein the selective alternating signal filter further comprises:
    a diode having a cathode end and an anode end connected to a nanowire at the anode end; and
    a reverse-bias source connected at the cathode end of the diode that supplies a signal to set a forward bias threshold for the diode.

5. The binary signal converter of claim 1 wherein when the nanowire carries a high original direct signal, the amplitude of the superimposed alternating signal decreases below a threshold amplitude.

6. The binary signal converter of claim 5 wherein when the amplitude of the superimposed alternating signal decreases below a threshold amplitude, the nanowire has a binary value "1."

7. The binary signal converter of claim 1 wherein when the nanowire carries a low original direct signal, the amplitude of the superimposed alternating signal remains above a threshold amplitude.

8. The binary signal converter of claim 7 wherein when the amplitude of the superimposed alternating signal remains above a threshold, the nanowire has a binary value of "0."

9. The binary signal converter of claim 1 wherein the original direct signal is carried by a multiplexer/demultiplexer nanowire.

10. A method for determining whether a high original direct signal or a low original direct signal is being carried on a nanowire, the method comprising:
    providing an alternating signal source connected to the nanowire that superimposes an alternating signal with an initial amplitude on the nanowire;
    providing a selective alternating signal filter that selectively passes the alternating signal from the nanowire to a signal sink; and
    determining whether a high or low direct signal is carried by the nanowire based on detecting an oscillation in the superimposed signal carried by the nanowire.

11. The method of claim 10 wherein each of the original direct signal and alternating signal are one of a voltage signal or a current signal.

12. The method of claim 10 wherein the alternating signal source further comprises an alternating signal source wire that connects the alternating signal source to the nanowire.

13. The method of claim 10 wherein the selective alternating signal filter further comprises:
    a diode having a cathode end and an anode end connected to a nanowire at the anode end; and
    a reverse-bias source connected at the cathode end of the diode that supplies a signal to set a forward bias threshold for the diode.

14. The method of claim 13 wherein the original direct signal is a signal and wherein the method further comprises supplying a reverse bias $V_{rev}$ from the reverse-bias source to modify the diode forward-bias threshold according to the following condition:

$$V_{ml} < V_{rev} + V_t < V_{mh}$$

where $V_{ml}$ is a gray scale-signal-range minimum,
$V_{mh}$ is a gray-scale-signal-range maximum, and
$V_t$ is the diode forward-bias threshold.

15. The method of claim 14 further comprises superimposing an alternating signal on the nanowire according to the following condition:

$$V_{ml} < V_{rev} + V_t \pm V_{AC} < V_{mh}$$

where $V_{AC}$ is the magnitude of the alternating signal.

16. The method of claim 10 wherein determining whether a high or low direct signal is carried by the nanowire further comprises, when the nanowire is carrying a high original direct signal, the amplitude of the superimposed alternating signal decreases below a threshold amplitude.

17. The method of claim 16 wherein, when the amplitude of the superimposed alternating signal decreases below a threshold, the nanowire has a binary value "1."

18. The method of claim 10 wherein determining whether a high or low direct signal is carried by the nanowire further comprises, when the nanowire is carrying a low original direct signal, the amplitude of the superimposed alternating signal remains above a threshold amplitude.

19. The method of claim 18 wherein, when the amplitude of the superimposed alternating signal remains above a threshold, the nanowire has a binary value of "0."

20. A multiplexer/demultiplexer nanowire that tolerates gray scale signal levels comprising:
    a nanowire that carries an original signal;
    an alternating signal source connected to the nanowire that superimposes an alternating signal with an initial amplitude on the original signal carried by the nanowire;
    a diode having an anode end connected to the nanowire and a cathode end connected to a voltage sink; and
    a reverse-bias source connected at the cathode end of the diode that supplies a signal to set a forward bias threshold for the diode that selectively passes the alternating signal from the nanowire to the voltage sink.

21. The multiplexer/demultiplexer nanowire of claim 20 wherein the original direct signal and the alternating signal are each one of a voltage signal or a current signal.

22. The multiplexer/demultiplexer nanowire of claim 20 wherein the alternating signal source further comprises an alternating signal source wire that connects the alternating signal source to the nanowire.

23. The multiplexer/demultiplexer nanowire of claim 20 wherein when the nanowire carries a high original direct signal, the amplitude of the superimposed alternating signal decreases below a threshold amplitude.

24. The multiplexer/demultiplexer nanowire of claim 23 wherein when the amplitude of the superimposed alternating signal decreases below a threshold amplitude, the nanowire has a binary value "1."

25. The multiplexer/demultiplexer nanowire of claim 20 wherein when the nanowire carries a low original direct signal, the amplitude of the superimposed alternating signal remains above a threshold amplitude.

26. The multiplexer/demultiplexer nanowire of claim 25 wherein when the amplitude of the superimposed alternating signal remains above a threshold, the nanowire has a binary value of "0."

* * * * *